United States Patent [19]

Kmetz

[11] Patent Number: 4,506,955

[45] Date of Patent: Mar. 26, 1985

[54] INTERCONNECTION AND ADDRESSING SCHEME FOR LCDS

[75] Inventor: Allan R. Kmetz, Chatham, N.J.

[73] Assignee: AT&T Bell Laboratories, Murray Hill, N.J.

[21] Appl. No.: 492,458

[22] Filed: May 6, 1983

[51] Int. Cl.³ .................................................. G02F 1/13
[52] U.S. Cl. ..................................... 350/336; 350/333; 340/784; 340/802
[58] Field of Search ............... 350/333, 336; 340/784, 340/802

[56] References Cited

U.S. PATENT DOCUMENTS 4,060,801  11/1977  Stein et al. .................. 350/333 X
4,447,131   5/1984  Soma ............................ 350/333

FOREIGN PATENT DOCUMENTS 620036  10/1980  Switzerland .

OTHER PUBLICATIONS

K. Gillessen, C. Malinowski, A. J. Marshall and W. Schairer, "A Survey of Interconnection Methods which Reduce the Number of External Connections for LED Displays", Proceedings of the SID, vol. 22, No. 3, pp. 181-184 (1981).
I. A. Shanks and P. A. Holland, "Addressing Methods for Non-Multiplexed Liquid Crystal Oscilloscope Displays", SID 79 Digest, vol. 10, pp. 112-113 (1979).
D. W. Berreman and W. R. Heffner, "Fast Liquid Crystal Displays with Low-Power Addressing and Permanent Memory", SID International Symposium, vol. 13, pp. 242-243 (May 11-13, 1982).
A. R. Kmetz, "Interconnection and Addressing for LCD with Reduced Lead Count", SID International Symposium, vol. 13, pp. 182-183 (May 11-13, 1982).

Primary Examiner—John K. Corbin
Assistant Examiner—Richard F. Gallivan
Attorney, Agent, or Firm—Michael J. Urbano

[57] ABSTRACT

Liquid crystal elements are interconnected in an array of rows and columns, which are not independent of one another, and are addressed by pulsed signals which together reduce the number of leads N required to operate the display. The interconnection scheme includes connecting together the last column to the second row, the penultimate column to the third row, etc., and the first column to the last row. In one embodiment for randomly accessing the display, the addressing scheme divides a row-select signal and a column-select signal into two time-wise sequential subsets: a first subset which includes pulses of one polarity in the time slots corresponding to the elements in that row, and a second subset which includes pulses of either polarity depending on which elements in that column are to be turned on and which off. The coincidence of two pulses of opposite polarity applied to an element from the row-select and column-select signals in sufficent to turn on that element. Different addressing schemes are utilized in other embodiments for use as pseudo-analog pointer displays and bargraph displays.

7 Claims, 6 Drawing Figures

INTERCONNECTION AND ADDRESSING SCHEME FOR LCDS

BACKGROUND OF THE INVENTION

This invention relates to liquid crystal displays (LCDs) and, more particularly, to interconnection and addressing schemes which reduce the number of external leads needed to operate an LCD.

Only a dozen years after their introduction, liquid crystal displays now comprise a $500 million market, establishing them as the most important multicharacter display technology after CRTs. World-wide LCD production is well over 200 million pieces annually, largely for consumer electronics applications such as digital wristwatches and credit-card calculators which would be impractical with any other type of display. While most LCDs today are used in such battery-powered portable devices, they are capturing new areas of application because of their improving information capacity, unique optical properties, and their low system cost which arises from batch fabrication and a good match to low-voltage integrated circuits.

The overwhelming majority of LCDs use twisted nematic (TN) liquid crystal (LC) materials which are sandwiched between opposing glass substrates. Segmented transparent electrodes are deposited on the substrates. In the absence of an applied field, the TN-LC molecules form a spiral between aligned surfaces. Polarized light follows the spiral and experiences a 90° rotation. However, the application of only a few volts across the electrodes suffices to destroy the spiral in the region of the LC where the opposing electrodes overlap; i.e., the molecules line up like compass needles in a magnetic field so that the polarization of the light transmitted along the molecules is unaffected. The addition of polarizers and a reflector yields a device which can produce visible patterns by selectively modulating ambient white light. Thus, the LCD achieves high contrast over an acceptable field of view even in direct sunlight, with a power dissipation which is lower by several orders of magnitude than comparable displays which generate light themselves.

In a simple watch or instrument LCD, every individual display segment is connected to its own independent driver. No voltage is applied to unselected segments, while selected segments are turned on as hard as the supply voltage (typically 1.5–3 V) will allow. Because an unrestricted choice of drive voltage maximizes display performance, this simple direct-drive scheme is preferred whenever the number of display segments is not too large.

Direct addressing proves to be too expensive, however, for more complex displays. For example, at least two integrated circuits (ICs) would be needed for direct drive of the more than 64 character segments in the eight-digit calculator display. Matrix addressing provides a solution by allowing each drive line to control several segments. Connecting the segments of a calculator display into a matrix with three rows reduces the number of drive lines from 68 to 28, making possible an LCD calculator with only one IC. Today, most calculator displays are organized as matrices with three or four rows. The same matrix addressing technology is increasingly being used for digital displays in telephones, laboratory instruments and boating equipment. The fact that the display "segment" at each matrix intersection can have a complex shape is widely utilized in electronic games, with pictures ranging from Pac-man ™ to Popeye ™.

Unfortunately, the substantial economies of the matrix connection are won only with some sacrifice in simplicity and performance. When many elements are interconnected on the same address line, it is not possible to drive one element arbitrarily hard without inadvertently affecting other elements. An attempt to address a single element by energizing a single row and column may result in "sneak" conduction paths through nominally off LC elements, thereby giving rise to crosstalk. However, the sneak paths can be limited by connecting every lead to a low-impedance voltage source, with none left floating.

Typically, rows are pulsed cyclically while the information to be displayed is multiplexed onto the columns by synchronously choosing the polarity of column voltages to add to or subtract from the corresponding row pulses. It follows that, unlike direct addressing, the unselected elements in a matrix see a non-zero voltage with rms value $V_{off}$. In order for unselected elements to appear off, the LCD must have an electrooptic threshold higher than $V_{off}$.

It turns out also that the rms voltage $V_{on}$ which is seen by a selected element is not independent of $V_{off}$, rather it is proportional to $V_{off}$. Thus, raising $V_{on}$ also increases $V_{off}$ so a given segment cannot be driven too hard without causing spurious turn-on of other segments connected to the same matrix lines. Successful multiplexed operation, therefore, requires that the LCD be turned on acceptably by voltages not too far above threshold. FIG. 1 shows schematically the kind of electrooptic characteristic needed for multiplexing. The attainable ratio of $V_{on}$ to $V_{off}$ decreases as the number of rows in the matrix increases, because the dwell time for driving any given row becomes a smaller fraction of the addressing period. Clearly, a steeper curve is needed for a matrix with more rows.

In addition, a matrix with more rows, hence more picture elements and higher resolution, means higher addressing cost largely because the number of leads that must be driven increases with the number of resolution elements. For M elements interconnected as a matrix at least $2M^{\frac{1}{2}}$ leads are required. Conversely, N leads can address a matrix which contains no more than $\frac{1}{4}N^2$ elements. This limit was recently exceeded by an interconnection scheme which permits N leads to control $N(N-1)$ light emitting diodes (LEDs) through an addressing method based on three-state logic. See, K. Gillessen et al, *Proceedings of SID*, Vol. 22, p. 181 (1981). Both the reverse blocking characteristic and the sharp threshold for forward conduction of the LED are essential to this approach, so its extension to LCDs is not straightforward.

SUMMARY OF THE INVENTION

In accordance with my invention, the number of leads N needed to drive an array of M liquid crystal elements is reduced by a unique combination of an interconnection scheme and an addressing scheme. Although each LC element is connected to a column bus and a row bus, these buses are not independent of one another. Thus, the elements are arranged so that the first row and first column each contain (N−1) elements, the second row and second column each contain (N−2) elements, etc., and the last row and last column each contain a single element. That is, the n-th row and n-th column each contain (N−n) elements with one element in common. In addition, the first row of elements is connected to the first row bus, the second row of elements and the last column of elements (actually a single element) are both connected to the second row bus, the third row of elements and the penultimate column of elements are both connected to the third row bus, etc., and the last (N-th) row bus is connected only to the first column of (N−1) elements. Using this electrical interconnection scheme, the physical arrangement of the elements may take on a variety of geometrical patterns, e.g., rectangular, triangular or linear arrays. These arrays are addressed via N external leads connected to the N row buses.

In one embodiment for displaying any possible pattern on the array, the addressing scheme utilizes a pulsed signal having M time slots per frame applied to each row bus. Each time slot is uniquely associated with a distinct element. Only the coincidence of two pulses of opposite polarity applied to an element from different buses is sufficient to turn on an LC element. In particular, each bus contains (N−1) pulses divided into two illustratively time-wise sequential subsets. To address (turn on or off) an element (x,y) in the x-th column and y-th row, a row-select signal on the y-th row is constructed so that its first subset contains (N−y) pulses of one polarity in the time slots corresponding to the (N−y) elements in the y-th row, and its second subset contains (y−1) pulses (one or more of which may have the opposite polarity, but these pulses are related to the selection of other elements). In addition, a column-select signal on the (N+1−x)th row is constructed so that its first subset contains (x−1) pulses of one polarity, and its second subset contains (N−x) pulses of either polarity in the time slots corresponding to the (N−x) elements in the x-th column. The y-th pulse in the second subset of (N−x) pulses is of opposite polarity if the element (x,y) is to be turned on and of the same polarity if it is to be held off. For TN-LC elements all signals are repeated in the next frame with opposite polarity to complete the two-frame period with zero average voltage (i.e., to avoid generating a dc voltage which is known to have damaging electrochemical effects on a LC element).

This arrangement tacitly assumes that the addressing scheme must be capable of displaying any possible pattern on the array. However, considerable improvement in performance can be realized by taking advantage of a priori restrictions on the set of allowable patterns. This approach is employed illustratively in two alternative embodiments of my invention: a pseudo-analog pointer display which is addressed via mutually orthogonal signals applied to on elements and via identical signals applied to the single off element; and a bargraph which is addressed via bipolar pulsed signals in which m columns containing only on elements are addressed in m time slots of each frame, and a (m+1)th time slot has reversed polarity pulses to cancel dc. A column containing both on and off elements is addressed in a (m+2)th time slot, and the pulses of a (m+3)th time slot again cancel dc. These time slots may occur in any sequence.

BRIEF DESCRIPTION OF THE DRAWING

My invention, together with its various features and advantages, can be readily understood from the following, more detailed description taken in conjunction with the accompanying drawing, in which.

DETAILED DESCRIPTION

Figure 5:
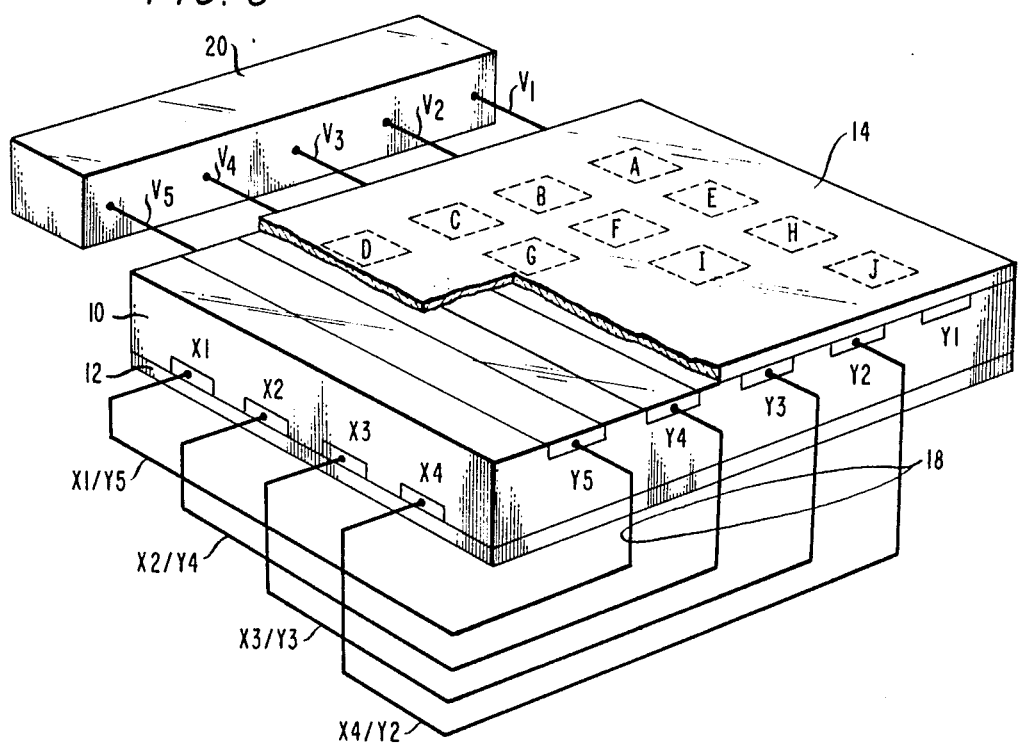
FIG. 5 is a cut-away, isometric view of an LCD of the type shown in FIG. 2 but has not been drawn to scale in the interest of clarity of illustration.

With reference now to FIG. 5, there is shown a LCD which includes a LC material in the form of a thin layer 10 (e.g., about 10 μm thick) sandwiched between opposing glass substrates 12 and 14. An illustrative array of elongated column electrode x1-x4 is deposited on the inside surface of substrate 12, and an array of elongated row electrodes y1-y5 is deposited on the interior surface of substrate 14. The two arrays are orthogonal to one another and comprise transparent material such as indium tin oxide. Thus, a LC element is defined as the portion of this structure at the intersection between a pair of overlapping electrodes. In this example there are M=10 such elements designated A to J.

In the interest of simplicity, the side members, which form a chamber with the substrates to enclose the LC material, as well as the usual polarizers, have been omitted.

In accordance with my invention, the row and column electrodes are not independent of one another. Rather, they are connected to one another, illustratively via cross connections 18, as follows: four column electrodes x1, x2, x3 and x4 are connected, respectively, to row electrodes y5, y4, y3 and y2 via cross connections x1/y5, x2/y4, x3/y3, and x4/y2. Row electrode y1 has no such cross connection. Pulsed voltage signals V1 to V5 are applied to the N=5 row electrodes y1 to y5, respectively, via a low impedance voltage source 20. Of course, a suitable computer may be used to control the waveforms generated by source 20.

The cross connections 18 may be made by several techniques known in the art; for example, by separate wires run to a printed circuit board or by silver epoxy dots located at appropriate locations between the substrates.

Figure 1:
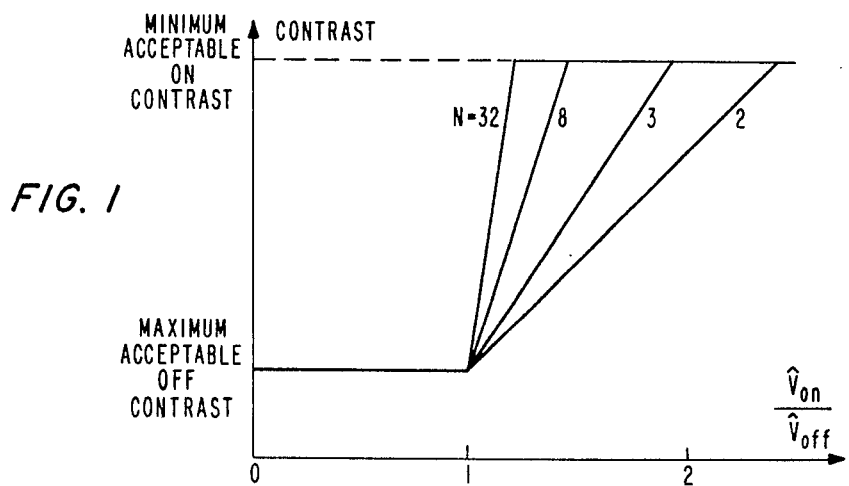
FIG. 1 is a graph of contrast versus the ratio of the on-off voltages of a LC element. The graph demonstrates that increasing the number of rows N in an array reduces the attainable selection ratio, requiring a LC element with a steeper threshold curve.
Figure 2:
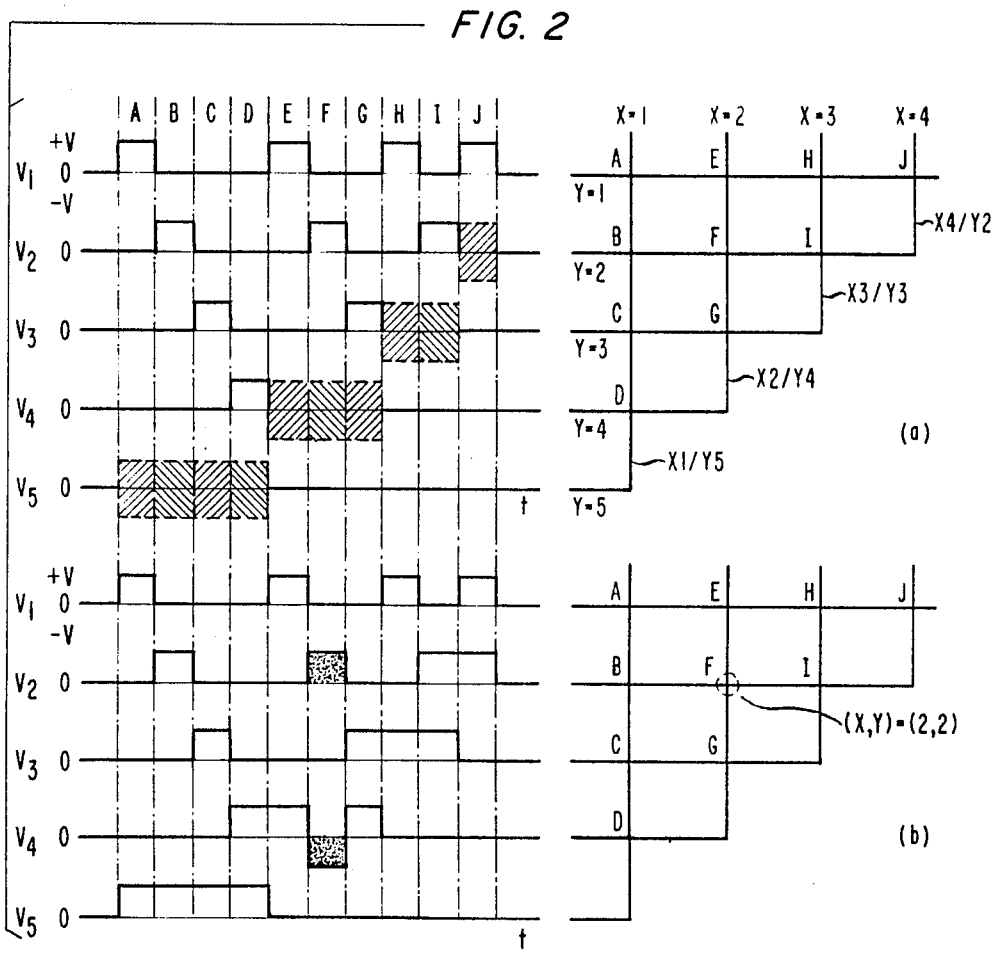
FIG. 2, Part (a) shows how an array of 10 LC elements are interconnected and addressed via only 5 leads in accordance with an illustrative embodiment of my invention; and Part (b) shows the waveform for turning on LC element F at location (x,y)=(2,2)
Figure 3:
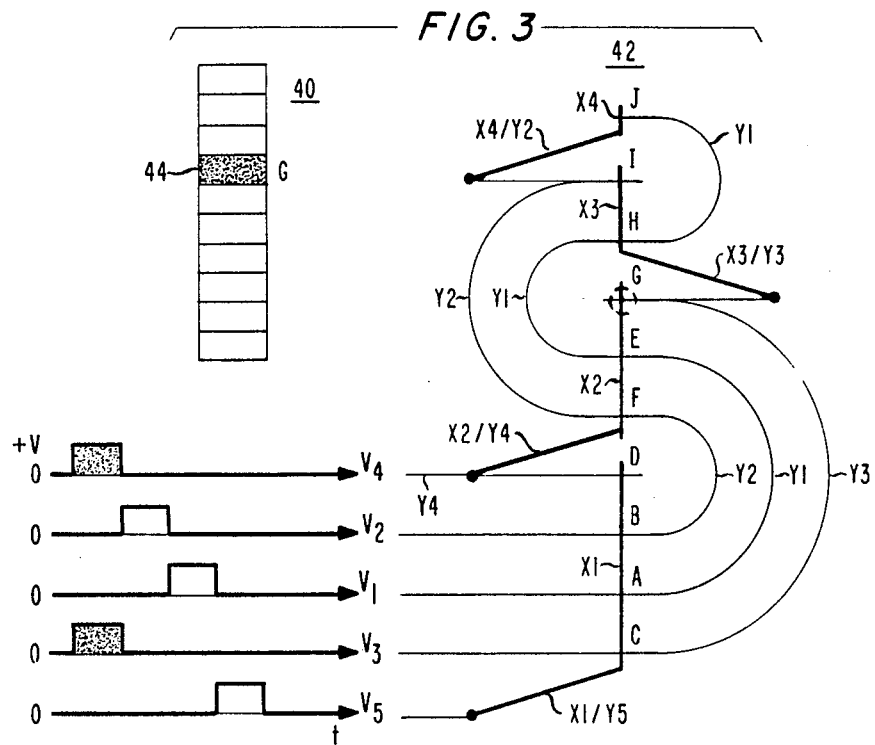
FIG. 3 shows how a modified meander interconnection scheme of LC elements is addressed for a pseudo-analog pointer display with fully saturated contrast in accordance with another embodiment of my invention.
Figure 6:
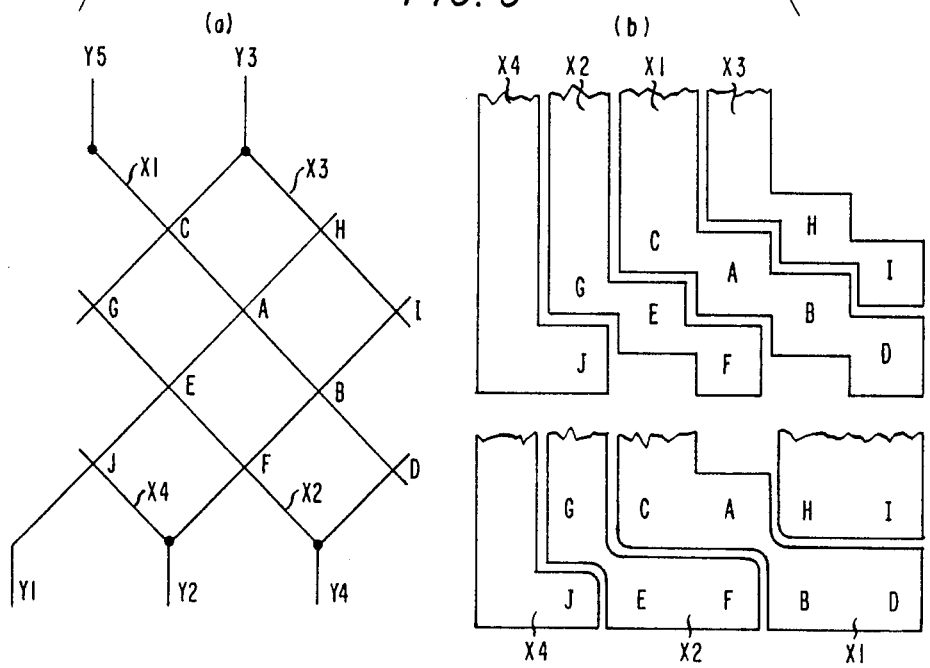
FIG. 6 shows that the interconnection scheme of my invention can be laid out to realize a rectangular pattern of elements.

As mentioned previously, using this electrical interconnection scheme, the physical arrangement of the elements may take on a variety of geometrical patterns. A triangular array is shown in FIG. 5, a linear array is shown in FIG. 3 (to be described later) and a rectangular array is shown in FIG. 6. Rectangular arrays of elements are used for alphanumeric and graphics display in which any or all of the elements may be freely selected. FIG. 6, Part (a) illustrates how the interconnection scheme of FIG. 2 may be rearranged to form a rectangular array with an aspect ratio approaching 2:1. FIG. 2, Part (b) illustrates the electrode pattern on one substrate to implement the Part (a) interconnection. The staggered arrangement of elements, like bricks in a wall, can be rectified if desired as shown in Part (c).

The manner in which this interconection of LC elements is addressed is best understood with reference to FIG. 2, Part (a) which depicts the waveforms of a sequence of five pulsed signals V1 to V5 applied, respectively, to the row electrodes y1 to y5 which are shown as the inputs to a schematic representation of the interconnection of the row and column electrodes. Only a single frame of each signal V1 to V5 is shown.

The 10 LC elements designated A to J are located at the intersections of each row and column. In a corresponding fashion, each frame of the signals is divided into 10 time slots which have also been designated A to J. Each time slot, therefore, has a one-to-one correspondence with one, and only one, LC element. Further, each time slot may contain either a positive pulse ($+V$) or negative pulse ($-V$). In this example, there are four pulses per frame on each external lead. If the element responds to peak voltages, then $|V|$ is less than the LC threshold ($V_{th}$), but $2|V|$ is greater than the threshold. But, if the element is rms-responding, as with TN-LCs, then $|V| \leq (V_{th}/2)[N(N-1)/(N-2)]^{\frac{1}{2}}$.

These pulses are divided into two illustratively timewise sequential subsets: a first subset of positive pulses and a second subset (cross-hatched) of either positive or negative pulses depending on which LC elements in a particular column are to be turned off or on. Thus, the first subset of signal V1 applied to row Y1 contains four positive pulses, one in each of time slots A, E, H, and J corresponding to LC elements A, E, H, and J in that row. But, the second subset contains no pulses. Similarly, the first subset of signal V2 has positive pulses in time slots B, F, and I corresponding to the same elements in row Y2, and its second subset has a single pulse in time slot J which is either negative or positive depending on whether element J is to be turned on or off, respectively. Continuing in the same fashion, the first subset of signal V3 contains positive pulses in time slots C and G, and its second subset contains pulses in time slots H and I each of which is either negative or positive depending upon whether elements H and I are to be turned on or off, respectively. Signal V4 has a first subset which includes a single positive pulse in time slot D and a second subset which includes three pulses in time slots E, F, and G each of which, as before, is either negative or positive depending on whether elements E, F, and G are to be on or off, respectively. Finally, signal V5 contains no pulses in its first subset but contains four pulses in time slots A, B, C, and D of its second subset, and each of these pulses is either negative or positive depending on whether elements A, B, C, and D are to be on or off, respectively.

To turn on a particular element requires signals on two rows: a row-select and a column-select signal; i.e., it requires the coincidence of a positive pulse on one of the rows and simultaneously a negative pulse on another row. The negative pulse occurs on the row which is connected to the column containing that element. For example, in FIG. 2, Part (a) the LC element J is turned on by controlling source 20 to supply a negative pulse via column-select signal V2 in its time slot J. Thus, the coincidence of the positive pulse ($+V$) from row-select signal V1 and the negative pulse ($-V$) from column-select signal V2, both pulses being in time slot J, is effective to turn on LC element J. In a similar fashion, LC element B is turned on by the coincidence of the positive pulse in signal V2 and a negative pulse in signal V5, both pulses occurring in time slot B.

A specific illustration of the half-period (single frame) waveforms for turning on element F, with all other elements off, is shown in FIG. 2, Part (b). In time slot F the positive pulse in row-select signal V2 and the negative pulse in column-select signal V4 (both pulses are shown stippled) are effective to turn on element F. Meanwhile, it can be shown by inspection of these waveforms that no other element in the array experiences simultaneously a positive and a negative pulse. Therefore, all other elements are off. This situation, of course, is illustrative only. It is indeed possible and often desirable that more than one element can be turned on simultaneously by simply providing the necessary simultaneity of positive and negative pulses in the same time slots of different signal waveforms.

In all of these cases, the signal waveforms in FIG. 2 represent a single frame which, as is well known in the art, should be repeated in the next frame of the waveform, but with opposite polarity for all pulses, so that the average value over two frames (one period) is essentially zero and no net dc voltage as supplied to the LC elements.

Although the foregoing illustration of a 10 element array driven by only five external leads is illustrative of the concepts of my invention, it should be clear that this scheme can be generalized to different size arrays in which $M=(N-1)N/2$ elements are addressed by N external leads. Briefly, to address an element (x,y) in the x-th column and y-th row, a row-select signal on the y-th row is constructed so that its first subset contains (N−y) pulses of one polarity in the time slots corresponding to the (N−y) elements in the y-th row, and its second subset contains (y−1) pulses (one or more of which may have the opposite polarity, but these pulses are related to the selection of other elements). In addition, a column-select signal on the (N+1−x)th row is constructed so that its first subset contains (x−1) pulses of one polarity, and its second subset contains (N−x) pulses of either polarity in the time slots corresponding to the (N−x) elements in the x-th column. The y-th pulse of the second subset of (N−x) pulses is of opposite polarity to turn (x,y) on or of the same polarity to turn (x,y) off. In the example given above in FIG. 2, Part (b), the element F corresponds to element (x,y)=(2,2).

Several practical considerations, the need to refresh and the available contrast, are worthy of comment. Regarding a refresh cycle, if the display device does not have intrinsic memory or long persistence, it should be refreshed fast enough that flicker is not perceptible; i.e., the addressing signals should be repeated at faster than a 30 Hz frame rate. Regarding contrast, to leave off, for example, element A, the signals V1 and V5 are both $+V$ in time slot A to produce zero potential difference across element A during the A interval. However, during the remainder of the frame, the addressing of the other elements will disturb element A by signals of $\pm V$. Counting these disturbances, one finds there are 2(N−2) pulses in the frame. For the example illustrated, N=5 and there are six disturb pulses on each and every element. If the display device is a refreshed liquid crystal display which responds to the rms value of the signals applied to it, then the performance obtained will be determined by the ratio of rms voltages on selected and unselected elements. Taking into account the disturb pulses gives to the following equation:

$$\frac{V_{on}}{V_{off}} = [N/(N-2)]^{\frac{1}{2}}.$$

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, considerable improvement in performance can be realized by taking advantage of a priori restrictions on the set of allowable patterns, as in a bargraph or pointer display.

Thus, in accordance with another embodiment of my invention, a ten-element pseudo-analog pointer display 40 shown in FIG. 3 utilizes a modified meander layout 42 so that the elements A to J can be arranged physically in a straight or curved line and can be interconnected electrically with fewer leads (N=5) than required in a matrix. Layout 42 is equivalent to the interconnection scheme of FIG. 2 except that the columns x1 to x4 are arranged in a straight line. Accordingly, like elements in FIGS. 2 and 3 are given identical reference numerals. The addressing scheme, however, is different. In particular, each lead y1 to y5 is connected to a voltage V1 to V5, respectively, whose waveform is a unique member of a set of orthonormal functions. Suitable sets of waveforms include phase-shifted pulses (shown), pseudorandom binary sequences (see I. A. Shanks et al, *SID Symposium Digest*, Vol. 10, p. 112 (1979)), and walsh functions (see A. R. Kmetz, Swiss Pat. No. 620036-C47 (1978)). Then every display element turns on equally because the rms potential difference across every intersection is equal. To create the dark pointer 44 against this bright background, any single intersection (x,y) can be turned off my making $V_{N+1-x} = V_y$ so that the potential difference across the selected display element becomes zero. As illustrated, element G, which is circled and corresponds to (x,y)=(2,3), is turned off by making $V_4 = V_3$; i.e., by making $V_4$ and $V_3$ to be identical waveforms. Implementation of this addressing scheme is simplified by the fact that the low-voltage binary waveforms used can be generated by ordinary digital integrated circuits.

A linear array of 28 LCD segments was interconnected according to a modified meander scheme of the type shown in FIG. 3. The twisted nematic LCD had parallel polarizers to obtain positive contrast; positive contrast would have been obtained directly if the usual guest-host effects had been used instead. A total of eight external connections, with seven front-to-back-plate crossovers, was sufficient. Three additional connections would have been needed for a conventional matrix arrangement.

These eight pins were driven directly by the standard digital output port of a CMOS EPROM which contained the layout and waveform information. The three low-order (rapidly changing) bits of an oscillator/counter cycled through the addresses corresponding to the different waveform intervals, while the high-order bits slowly swept the quantity displayed by the pointer to exercise the demonstration device. Connecting the high-order address bits instead to an A/D converter would yield a voltmeter.

Figure 4:
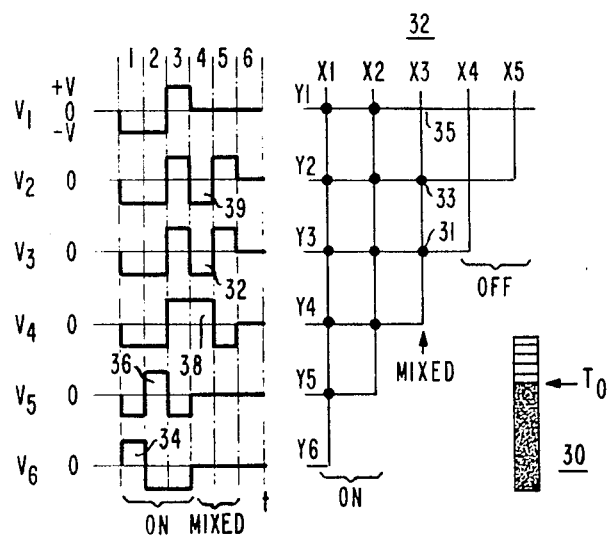
FIG. 4 shows an addressing scheme for a bargraph display in accordance with yet another embodiment of my invention.

Another embodiment of my invention which exploits a priori pattern limitations is the pseudo-analog bargraph display 30 shown in FIG. 4. The bargraph format conveys no more information than the pointer, but it may be more legible. Here, N=6 leads drive a linear arrangement of M=15 adjacent display elements which indicates some variable such as temperature or speed. Every display element below the indicated value $T_o$ is turned on and every element above the indicated value is turned off. The display elements are interconnected electrically into a linear array 32 of the type shown as array 42 in FIG. 3, and the bipolar pulsed signals V1 to V6 are used advantageously for addressing.

These signals each have N=6 time slots which contain either a positive or negative voltage pulse (±V) or a reference voltage (e.g., zero). First, each lead which connects only to elements which are to be turned on (black dots) is driven with a positive pulse (+V) while simultaneously all other leads are held negative (−V). Thus, lead y6 connected to column x1 is driven with a positive pulse 34 in the first time slot, and leads y1 to y5 are driven with negative pulses. Similarly, lead y5 connected to column x2 is driven with a positive pulse 36 in the second time slot. This procedure is repeated for each of the m columns (here m=2) which contain only on elements. Then, in the (m+1)th time slot (here, the third), the m leads which had been driven positive in the preceding m time intervals are driven negative simultaneously while all other leads are held positive. This has the effect of applying +2 V and −2 V in different intervals to each element in columns x1 to xm which contain only on elements. Consequently, columns of all-on elements are addressed in m+1=3 intervals, with zero average dc value and with no disturbance of unselected elements.

Unless the end of the bar happens to coincide with the end of a column, the group of elements containing the end of the bar remains to be addressed. This group includes a column (e.g., x3) containing both on elements (black dots) and off elements (absence of dots). Such a column is labeled mixed. A mixed column such as x3 is addressed in the (m+2)=4th time slot by applying a positive pulse 38 to the (N+1−x)=4th lead which is common to that column while simultaneously applying negative pulses 37 and 39 to leads 2 and 3 so as to turn on elements 31 and 33 in that group. The reference level (zero) is simultaneously applied to the leads 1, 5 and 6 connected to off elements (e.g., 35). Then, in the (m+3)=5th time slot the pulses of the (m+2)=4th time slot are repeated with reverse polarities to cancel any dc value. On elements (e.g., 31, 33) in this mixed group receive twice the voltage of off elements (e.g., 35) in that group, and half-select disturbances appear elsewhere in the array. At most N intervals are needed in the addressing period, where, as before, N is the number of leads. On elements see an rms voltage of $V(8/N)^{\frac{1}{2}}$ or $V(10/N)^{\frac{1}{2}}$; off elements see $V(2/N)^{\frac{1}{2}}$ or 0. The worst-case discrimination ratio is thus 2, with a ±6% nonuniformity in the voltage on selected elements.

The various embodiments of my invention may incorporate different types of LC elements; i.e., rms-responding elements (such as TN-LCs or guest-host LCs) or memory elements (such as those described by D. W. Berreman et al in *SID Symposium Digest*, Vol. 13, p. 242 (1982)).

What is claimed is:

1. Display apparatus comprising:

a planar liquid crystal device including a plurality of $(N-1)$ row electrodes on one side thereof and a plurality of $(N-1)$ column electrodes on an opposing side thereof, said row electrodes overlapping said column electrodes in different spatial planes so as to define an array of M liquid crystal elements;

said row electrodes being interconnected with said columnn electrodes so that said array is addressable via N row electrodes, where $M=(N-1)N/2$, the n-th row and n-th colum of said array each containing $(N-n)$ of said elements and one element in common, where $n=1,2,\ldots(N-n)$, the x-th column electrode $(x=1,2,\ldots N-1)$ being connected to the y-th row electrode, where $y=N+1-x$, and signal means connected to said N row electrodes for addressing said elements.

2. The display of claim 1 wherein said device is an rms-responding device.

3. The display of claim 1 for addressing element (x,y) corresponding to the overlap of the x-th column electrode with the y-th row electrode wherein said signal means applies to one of said N row electrodes a pulsed row-select signal and to another of said row electrodes a pulsed column-select signal, each having M time slots per frame and each time slot being uniquely associated with a separate element, each frame containing $(N-1)$ pulses divided into two subsets, said row-select signal being applied on the y-th row electrode and containing a first subset of $(N-y)$ pulses of one polarity in the time slots corresponding to the $(N-y)$ elements in the y-th row and second subset of $(y-1)$ pulses one or more of which may have the opposite polarity, and said column-select signal being applied on the $(N+1-x)$th row electrode and containing a first subset of $(x-1)$ pulses of one polarity and a second subset of $(N-x)$ pulses of either polarity in time slots corresponding to the $(N-x)$ elements in the x-th column, the y-th pulse of said second subset of $(N-x)$ pulses being of opposite polarity if element (x,y) is to be turned on and of the same polarity if (x,y) element is to be off.

4. The display of claim 3 wherein said signal means repeats said row-select and column-select signals in the next frame, each with opposite polarity compared to the prior frame.

5. The display of claim 1 for use as a pointer display wherein said column electrodes are arranged essentially along a line and said row electrodes follow a meander pattern, and said signal means applies to each of said N row electrodes a voltage waveform which is a unique member of a set of orthonormal functions, and to turn on an element (x,y) corresponding to the overlap of the x-th column with the y-th row said signal means applies a waveform on the y-th row electrode and an essentially identical waveform on the $(N+1-x)$th row electrode.

6. The display of claim 5 wherein said signal means applies an orthonormal set of phase-shifted pulse waveforms to said row electrodes.

7. The display of claim 1 for use as a bargraph display wherein said elements are arranged essentially along a line, and said signal means applies to each row electrode a pulsed signal having N time slots per frame, m time slots corresponding to $m=0,1,\ldots(N-1)$ columns containing only on elements, each of said time slots containing a pulse of one polarity applied to the $(N+1-m)$th row electrode and pulses of opposite polarity applied to all other electrodes, and in a $(m+1)$th time slot said signal means applies to the m row electrodes, to which pulses of said one polarity were applied, simultaneously pulses of said opposite polarity and said signal means applies simultaneously to the remainder of said row electrodes, to which pulses of said opposite polarity were applied, pulses of said one polarity, and in a $(m+2)$th time slot said signal means applies to any mixed column having both on and off elements a pulse of said one polarity to the $(N+1-x)$th row electrode and simultaneously pulses of said opposite polarity to row electrodes corresponding to on elements in said mixed column and applies a reference voltage simultaneously to row electrodes corresponding to off elements, and in a $(m+3)$th time slot said signal means repeats the pulses of the (m2)th time slot but with reversed polarity.

* * * * *